(12) United States Patent
Jacobs

(10) Patent No.: US 6,787,187 B2
(45) Date of Patent: Sep. 7, 2004

(54) MICROMECHANICAL DEVICE FABRICATION

(75) Inventor: Simon Joshua Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,698

(22) Filed: Dec. 31, 2001

(65) Prior Publication Data

US 2002/0132062 A1 Sep. 19, 2002

Related U.S. Application Data

(60) Provisional application No. 60/258,998, filed on Dec. 29, 2000.

(51) Int. Cl.$^7$ ................................................ C23C 16/50
(52) U.S. Cl. ..................... 427/255.6; 427/99; 427/569; 427/154; 427/289
(58) Field of Search .............................. 427/255.6, 99, 427/569, 154, 289

(56) References Cited

U.S. PATENT DOCUMENTS

| | | | |
|---|---|---|---|
| 5,061,049 A | | 10/1991 | Hornbeck |
| 5,583,688 A | | 12/1996 | Hornbeck |
| 5,882,532 A | * | 3/1999 | Field et al. ..................... 216/2 |
| 5,888,884 A | * | 3/1999 | Wojnarowski ............... 438/462 |
| 6,509,574 B2 | * | 1/2003 | Yuan et al. .................. 250/551 |

* cited by examiner

Primary Examiner—Bret Chen
(74) Attorney, Agent, or Firm—Charles A. Brill; Wade James Brady, III; Frederick J. Telecky, Jr.

(57) ABSTRACT

A method of fabricating a micromechanical device. Several of the micromechanical devices are fabricated 20 on a common wafer. After the devices are fabricated, the sacrificial layers are removed 22 leaving open spaces where the sacrificial layers once were. These open spaces allow for movement of the components of the micromechanical device. The devices optionally are passivated 24, which may include the application of a lubricant. After the devices have been passivated, they are tested 26 in wafer form. After testing 26, any surface treatments that are not compatible with the remainder of the processing steps are removed 28. The substrate wafer containing the completed devices receives a conformal overcoat 30. The overcoat layer is thick enough to project the micromechanical structures, but thin and light enough to prevent deforming the underlying micromechanical structures. Once the devices on the wafer are overcoated, the wafer is separated 32, and the known good devices are cleaned 34 to remove debris left by the dicing process. Once the devices are separated and cleaned, the overcoat may be removed, however, the overcoat typically is left in place to protect the device during the initial stages of the packaging process. Typically the devices are mounted 36 in the package substrate, the overcoat removed 38 from the devices, and the package containing the micromechanical device finished by sealing the package to enclose the device.

39 Claims, 3 Drawing Sheets

MICROMECHANICAL DEVICE FABRICATION

This application claims priority under 35 USC §119(e)(1) of provisional application No. 60/258,998 filed Dec. 29, 2000.

CROSS-REFERENCE TO RELATED APPLICATIONS

The following patents and/or commonly assigned patent applications are hereby incorporated herein by reference:

| Patent No. | Filing Date | Issue Date | Title |
|---|---|---|---|
| 5,061,049 | Sep. 13, 1990 | Oct. 29, 1991 | Spatial Light Modulator and Method |
| 5,583,688 | Dec. 21, 1993 | Dec. 10, 1996 | Multi-Level Digital Micromirror Device |
| 09/886,781 | Jun. 21, 2001 | | Re-coating MEMS devices Using Dissolved Resins |
| 10/038,791 | Dec. 31, 2001 | | Micromechanical Device Recoat Methods |

FIELD OF THE INVENTION

This invention relates to the field of micromechanical systems, more particularly to methods of manufacturing micromechanical devices.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirror devices are one type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

Micromirror devices are primarily used in optical display systems. In display systems, the micromirror is a light modulator that uses digital image data to modulate a beam of light by selectively reflecting portions of the beam of light to a display screen. While analog modes of operation are possible, micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, farther improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Other micromechanical devices include accelerometers, pressure and other sensors, and motors. These devices all share the common feature of having very fragile structures. The fragile structures can make it difficult to manufacture the micromechanical devices, especially in a cost effective manner. For example, once the sacrificial layers beneath the micromirror have been removed, the mirrors are very fragile and very susceptible to damage due to particles.

Because the particles become trapped in the mechanical structure of the micromirror array, and because the particles cannot be washed out of the array, it is necessary to separate the wafers on which the devices are formed, and wash the debris off the devices, prior to removing the sacrificial layers under the mirrors—also called undercutting the mirrors. Furthermore, because the chip bond-out process also creates particles, it is desirable to mount the device in a package substrate and perform the chip bond-out process prior to undercutting the mirrors.

Unfortunately, it is only after the mirrors have been undercut that the micromirror array is able to be tested. Assuming the production flow described above, all of the devices manufactured must be mounted on package substrates, bonded-out to the substrates, and undercut prior to testing the devices. Additionally, micromirrors typically require some sort of lubrication to prevent the micromirror from sticking to the landing surfaces when it is deflected. Therefore, the devices must also be lubricated and the package lid or window applied prior to testing the devices. Because a typical micromirror package is very expensive, the packaging costs associated with devices that do not function greatly increase the cost of production and must be recovered by the devices that do function.

What is needed is a method of testing the micromechanical structure of a micromirror array prior to packaging the micromirror array. This method would enable a production flow that would only package the known good devices. Thus, the significant cost associated with the packaging the failed die would be eliminated.

SUMMARY OF THE INVENTION

Objects and advantages will be obvious, and will in part appear hereinafter and will be accomplished by the present invention which provides a method for coating micromechanical devices. One embodiment of the claimed invention provides a method of fabricating a micromechanical device. The method comprises forming a micromechanical devices, overcoating the micromechanical devices, and later removing the overcoat from the micromechanical devices.

Another embodiment of the present invention provides a method comprising: forming at least two micromechanical devices on a common substrate; overcoating the micromechanical devices using vapor deposition; separating said common substrate to separate the devices; and removing the overcoat from the micromechanical devices.

Another embodiment of the present invention provides a method comprising: forming at least two micromechanical devices on a common substrate; providing a plasma of an organic gas; generating reactive intermediaries of the plasma; depositing an overcoat of the reactive intermediaries on the micromechanical devices; separating the common substrate to separate the micromechanical devices; and removing the overcoat from the micromechanical devices.

Another embodiment of the present invention provides a method comprising: forming at least two micromechanical devices on a common substrate; providing an organic gas; exposing the organic gas to an electrical corona discharge to generate reactive intermediaries of the organic gas; depositing the reactive intermediaries on the micromechanical devices; separating the common substrate to separate the micromechanical devices; and removing the overcoat from the micromechanical devices.

Another embodiment of the present invention provides a method comprising: forming at least two micromechanical devices on a common substrate; providing an organic gas; exposing the organic gas to at least one electrical conductor held at a high voltage potential to generate reactive intermediaries of the organic gas; depositing the reactive intermediaries on the micromechanical devices; separating the common substrate to separate the micromechanical devices; and removing the overcoat from the micromechanical devices.

Another embodiment of the present invention provides a method comprising: forming at least two micromechanical devices on a common substrate; providing an organic gas; heating the organic gas to generate reactive intermediaries of the organic gas; depositing the reactive intermediaries on the micromechanical devices; separating the common substrate to separate the micromechanical devices; and removing the overcoat from the micromechanical devices.

Another embodiment of the present invention provides a method comprising: forming at least two micromechanical devices on a common substrate; providing an organic gas; exposing the organic gas to a heated filament to generate reactive intermediaries of the organic gas; depositing the reactive intermediaries on the micromechanical devices; separating the common substrate to separate the micromechanical devices; and removing the overcoat from the micromechanical devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A method has been developed to allow a fully fabricated micromechanical device to be coated with a protective overcoat. This method enables a wafer of micromechanical devices, such as a micromirror device, to be fully fabricated, lubricated, and tested prior to separating the wafer into individual devices. This method protects the devices by applying a protective overcoat to the devices, and removing the overcoat after the wafer has been separated and the debris washed from the surface of the wafer.

Figure 1:
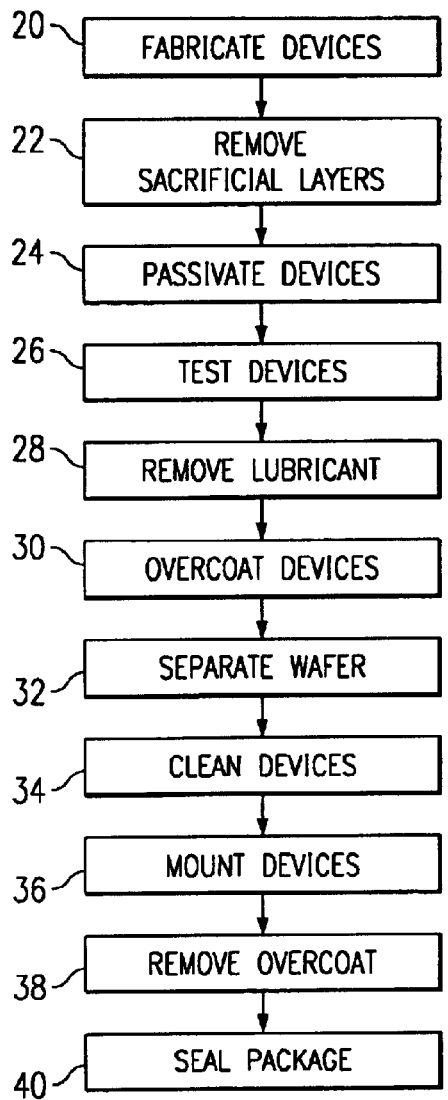
FIG. 1 is a block diagram of a method of fabricating a micromechanical device according to the present invention.

FIG. 1 is a block diagram of a method of fabricating a micromechanical device according to the present invention. Several of the micromechanical devices, which typically are microelectromechanical systems or MEMS, are fabricated 20 on a common wafer. Typical micromechanical devices are fabricated on one or more sacrificial layers. The sacrificial layers typically are photoresist. The sacrificial layers provide support for the various components of the micromechanical device during the fabrication process.

After the devices are fabricated, the sacrificial layers are removed 22 leaving open spaces where the sacrificial layers once were. These open spaces allow for movement of the components of the micromechanical device. For example, an accelerometer proof mass may defect into the open space, a motor may turn in the open space, or member may be deflected into the open space using electrostatic or electromagnetic force.

Moving devices typically require some sort of passivation of the surfaces of the device that will contact. The optional passivation 24 reduces the surface energy of the device, lowering the stiction encountered when various surfaces of the device come into contact. Part of the passivation process may include the addition of a lubricant to the device. For example, micromirror devices typically include a lubricant such as perfluorodecanoic acid, or PFDA. The PFDA is applied by activating the surface of the device and exposing the surface of the device to a PFDA vapor. The PFDA in the vapor condenses out of the vapor onto all of the surfaces of the device, forming a monolayer with a very low surface energy.

After the devices have been passivated, if necessary, they are tested 26 in wafer form. This test is the first opportunity to perform a fully functional test of the microstructure. The results of this functional test are recorded for later reference. After the wafer is separated, the devices that are known to be functional will be packaged, while the devices that are known not to function will be scrapped.

Once the testing 26 is complete, any surface treatments, such as a lubricant, that are not compatible with the remainder of the processing steps are removed 28. For example, PFDA lubricant is not compatible with the additional processing steps and is removed. The lubricant may be removed by an ash step. Compatible lubricants and surface treatments may be left in place.

The substrate wafer containing the completed devices receives a conformal overcoat 30. To avoid damaging the fragile devices, the overcoat is applied in vapor form to the wafer. When the overcoat layer is applied to a micromirror wafer, it typically seals the gaps between the micromirrors but does not fill the cavity beneath the micromirrors. In other words, the overcoat typically does not replace the sacrificial spacer layers on which the micromechanical device was fabricated. The overcoat layer is thick enough to project the micromechanical structures, but thin and light enough to prevent deforming the underlying micromechanical structures. The method of applying the overcoat is described in detail below.

Once the devices on the wafer are overcoated, the wafer is separated 32. Typical wafer separation processes include sawing through the wafer, scribing and deforming the wafer to break the wafer along the scribe lines, and a partial saw break process in which the wafer is sawn part of the way through and then broken by deforming the wafer against a dome or roller. Any wafer separation process used in semiconductor wafer manufacturing likely may be used to separate the overcoated wafer.

Once the wafer or common substrate has been separated, or diced, the individual devices that tested good are collected and the known failed devices are scrapped. The known good devices are cleaned 34 to remove debris left by the dicing process. The cleaning process typically uses a water stream to rinse the debris from the surface of the wafer. Alternatively, the dicing debris may be blown from the surface of the devices by an air stream. Thus, the overcoat must be strong enough to resist the forces created by whatever cleaning method is used.

Once the devices are separated and cleaned, the overcoat may be removed. Since the devices will be packaged, however, the overcoat typically is left in place to protect the device during the initial stages of the packaging process. In the case of micromirror devices, the devices are mounted 36 in the package substrate.

The overcoat is removed 38 from the devices. The overcoat is removed by a process appropriate for the overcoat material and the nature of the device being coated. For example, a dry plasma etch or ash process may be used, or a wet chemical removal followed by a drying process. A dry process typically exerts less force on the micromechanical device and is therefore less likely to damage the frail structures of the device. A wet chemical process, however, is more likely to thoroughly clean the device.

Once the overcoat is completely removed, the package containing the micromechanical device is finished. Electrical connections, or bond wires, typically are connected between the device and electrical connections within the package substrate. The package is then sealed to enclose the device. For example, micromirror packages have a window attached to the package substrate.

Figure 2:
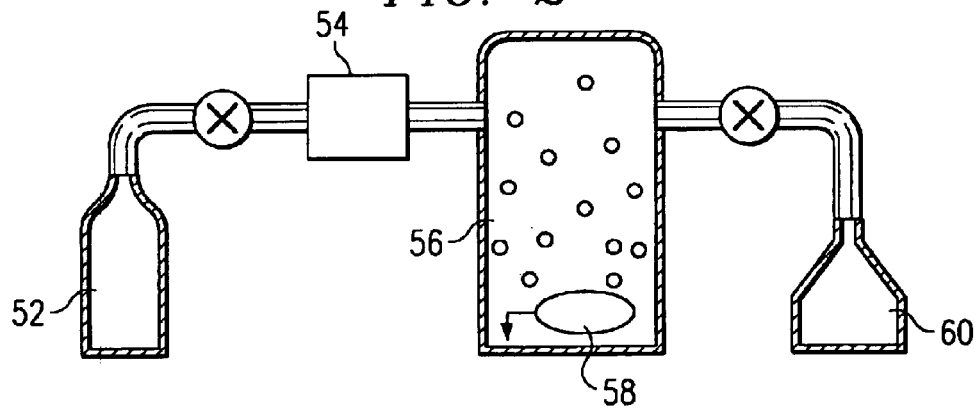
FIG. 2 is a schematic view of an apparatus for coating micromechanical devices.

FIG. 2 is a schematic view of an apparatus for coating micromechanical devices. In FIG. 2, a source of overcoat material 52 is provided. The overcoat material typically is an organic gas. The choice of overcoat materials depends on the structure being protected, the method used to activate the overcoat material, and the methods used to remove the overcoat materials. Typical overcoat materials include p-xylylene polymers—commercially known as PARYLENESTM, flourocarbon polymers—typically deposited from hexafluoropropylene oxide (HFPO), vinylic hydrocarbons, fluorocarbons, and others used in plasma polymerization.

The overcoat material is provided to an activation region 54 which activates the overcoat material. The activation region 54 activates the feed gas to create charged and neutral reactive intermediates. The reactive intermediates enter a deposition chamber 56 and deposit on the micromechanical devices and their substrate 58. The deposited intermediates polymerize to form the conformal protective coating on the substrate. Waste gasses are captured in trap 60.

Any one of several activation methods may be used. One embodiment creates a plasma of the feed gas. The substrate may be held at a voltage potential to increase the attraction between the intermediates and the substrate wafer containing the micromechanical devices. FIG. 2 shows the wafer 58 held at a ground potential. Feed gases suitable for plasma polymerization include vinylic hydrocarbons, and fluorocarbons.

Corona discharge may be used to activate the feed gas. Corona discharge polymerization uses one or more electrical conductors, typically a series of thin wires, held at a high potential. The charged and neutral intermediaries are created as the feed gas passes over the thin wires. Feed gases suitable for corona discharge polymerization include vinylic hydrocarbons, and fluorocarbons.

Hot filament polymerization may also be used to activate the feed gas. Hot filament polymerization uses one or more heated filaments, or a heated zone of the gas conduit, to pyrolyze an appropriate chemical precursor. Feed gases suitable for hot filament polymerization include the class of p-xylylene polymers know commercially as PARYLENES™, and fluorocarbon polymers. The fluorocarbon polymers typically are deposited from a hexafluoropropylene oxide feed gas.

All of these methods of coating the micromechanical devices provide suitable protective coatings. While not necessary to protect planar surfaces of devices such as micromirror arrays, the conformal nature of the coatings lends itself to protecting complex three dimensional shapes. Because the coating is deposited from a vapor, ever extremely fragile devices may be coated without damage to the structures.

Figure 3:
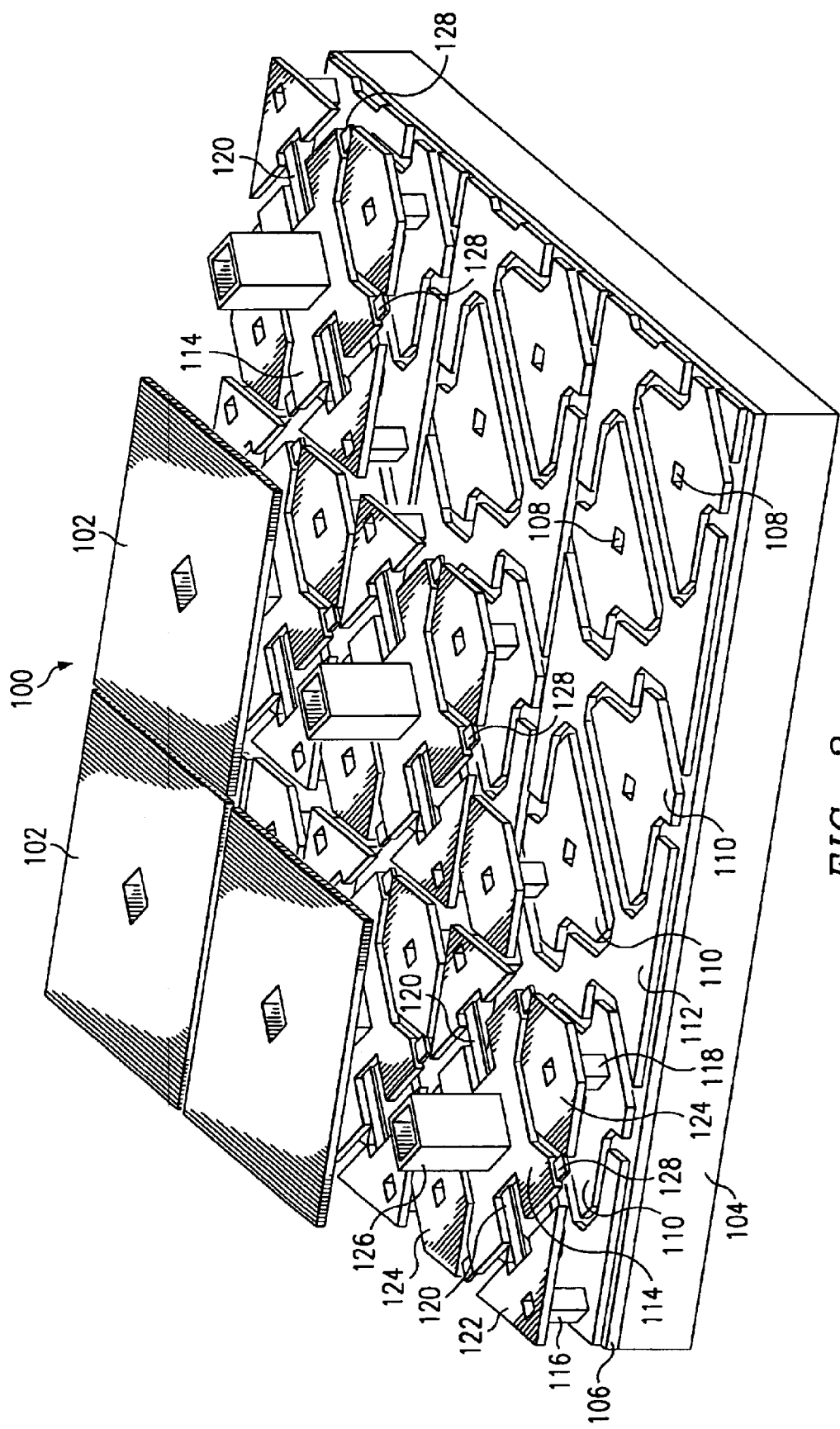
FIG. 3 is a perspective view of a small portion of a micromirror array of the prior art.
Figure 4:
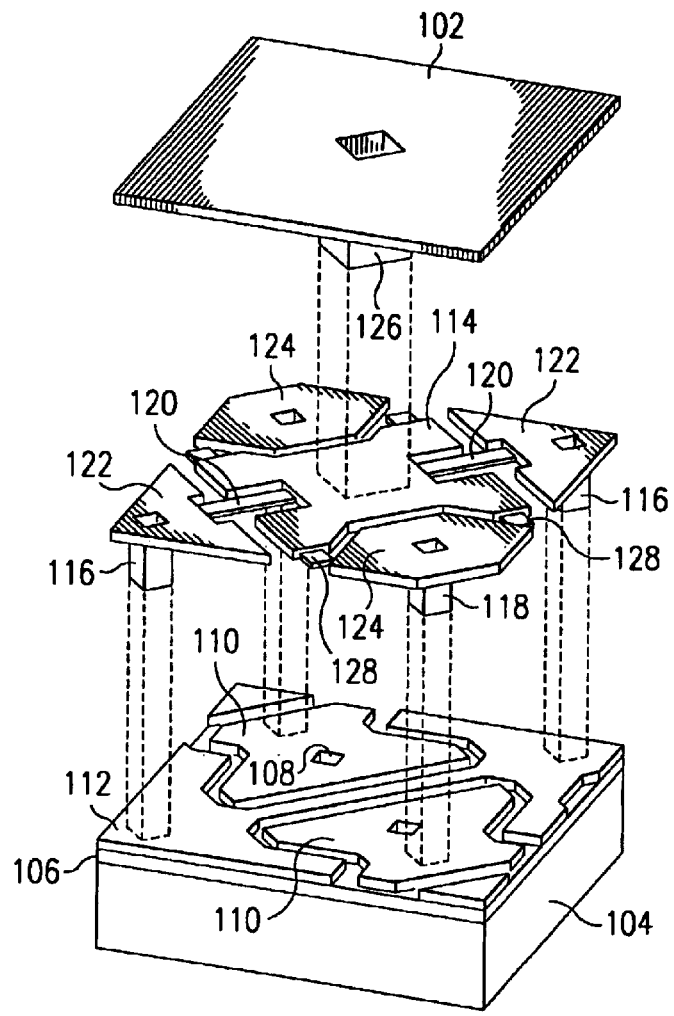
FIG. 4 is an exploded perspective view of a single micromirror element from the micromirror array of FIG. 3.

For purposes of example and not for purposes of limitation, one micromechanical structure that is especially difficult to manufacture without the overcoat process is a micromirror device. A typical hidden-hinge micromirror 100 is actually an orthogonal array of micromirror cells, or elements. This array often includes more than a thousand rows and columns of micromirrors. FIG. 3 shows a small portion of a micromirror array of the prior art with several mirrors 102 removed to show the underlying mechanical structure of the micromirror array. FIG. 4 is an exploded view of a single micromirror element of the prior art further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the micromirror substrate, or may be external to the micromirror. Image processing and formatting logic is also formed in the substrate 104 of some designs. For the purposes of this disclosure, addressing circuitry is considered to include any circuitry, including direct voltage connections and shared memory cells, used to control the direction of rotation of a micromirror.

The silicon substrate 104 and any necessary metal interconnection layers are isolated from the micromirror superstructure by an insulating layer 106 which is typically a deposited silicon dioxide layer on which the micromirror superstructure is formed. Holes, or vias, are opened in the oxide layer to allow electrical connection of the micromirror superstructure with the electronic circuitry formed in the substrate 104.

The first layer of the superstructure is a metalization layer, typically the third metalization layer and therefore often called M3. The first two metalization layers are typically required to interconnect the circuitry fabricated on the substrate. The third metalization layer is deposited on the insulating layer and patterned to form address electrodes 110 and a mirror bias connection 112. Some micromirror designs have landing electrodes which are separate and distinct structures but are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 116 or weld the mirror 102 to the address electrodes 110, in either case ruining the micromirror.

Since the same voltage is always applied both to the landing electrodes and the mirrors 102, the mirror bias connection and the landing electrodes are preferably combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Mirror bias/reset voltages travel to each mirror 102 through a combination of paths using both the mirror bias/reset metalization 112 and the mirrors and torsion beams of adjacent mirror elements. Split reset designs require the array of mirrors to be subdivided into multiple subarrays each having an independent mirror bias connection. The landing electrode/mirror bias 112 configuration shown in FIG. 3 is ideally suited to split reset applications since the micromirror elements are easily segregated into electrically isolated rows or columns simply by isolating the mirror bias/reset layer between the subarrays. The mirror bias/reset layer of FIG. 3 is shown divided into rows of isolated elements.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 μm thick layer of positive photoresist. After the photoresist layer is deposited, it is exposed, patterned, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops removed to leave thick rigid hinge yokes 114, hinge caps 122, and upper address electrodes 124, and thin flexible torsion beams 120.

A thick spacer layer is then deposited over the thick metal layer and patterned to define holes in which mirror support spacervias 126 will be formed. The thick spacer layer is typically a 2 μm thick layer of positive photoresist. A layer of mirror metal, typically an aluminum alloy, is sputtered on the surface of the thick spacer layer and into the holes in the thick spacer layer. This metal layer is then patterned to form the mirrors 102 and both spacer layers are removed using a plasma etch.

Once the two spacer layers have been removed, the mirror is free to rotate about the axis formed by the torsion hinge. Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque which is an approximately linear function of the angular deflection of the torsion beams. The structure rotates until the restoring torsion beam torque equals the electrostatic torque or until the rotation is mechanically blocked by contact between the rotating structure and a fixed component. As discussed below, most micromirror devices are operated in a digital mode wherein sufficiently large bias voltages are used to ensure full deflection of the micromirror superstructure.

Micromirror devices are generally operated in one of two modes of operation. The first mode of operation is an analog mode, sometimes called beam steering, wherein the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

Figure 5:
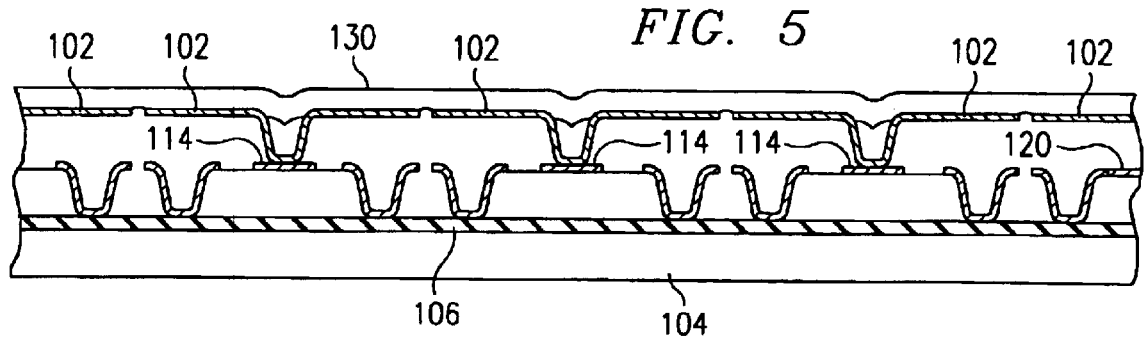
FIG. 5 is a cross section side view of a portion of the array of FIG. 3 showing a protective overcoat deposited according to the methods described herein.

FIG. 5 is a cross section side view of a portion of a micromirror array that has been overcoated according to the processes described herein. The structures shown in FIG. 5 are not to scale. Some structures, especially structures not on the cross section plane, are not shown in FIG. 5. In FIG. 5, a thin protective coating 130 has been applied over the mirrors 102 of the micromirror device. The thin coating 130 typically does not enter under the mirror array, but entry under the mirror array is acceptable provided the overcoat material 130 does not damage the mirror array and can be suitably removed from beneath the mirror array.

The protective coating 130 need only be thick enough to protect the mechanical structures of the device. Typically, a coating on the order of 1 to 5 $\mu$m thick is sufficient to protect the device. Coatings that are excessively thick may damage the device due to their weight, and typically are more difficult to remove.

Thus, although there has been disclosed to this point a particular embodiment of methods of recoating micromechanical devices, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of fabricating a micromechanical device, the method comprising:
   forming at least two micromechanical devices on a common substrate;
   overcoating said micromechanical devices using vapor deposition;
   separating said common substrate to separate said devices; and
   removing said overcoat from said micromechanical devices.

2. The method of claim 1, said vapor deposition comprising:
   providing a plasma of an organic gas;
   generating reactive intermediaries of said plasma; and
   depositing said reactive intermediaries on said micromechanical devices.

3. The method of claim 2, said organic gas comprising vinylic hydrocarbons.

4. The method of claim 2, said organic gas comprising fluorocarbons.

5. The method of claim 1, said vapor deposition comprising:
   providing an organic gas;
   exposing said organic gas to at least one electrical conductor held at a high voltage potential to generate reactive intermediaries of said organic gas; and
   depositing said reactive intermediaries on said micromechanical devices.

6. The method of claim 5, said organic gas comprising vinylic hydrocarbons.

7. The method of claim 5, said organic gas comprising fluorocarbons.

8. The method of claim 1, said vapor deposition comprising:
   providing an organic gas;
   heating said organic gas to generate reactive intermediaries of said organic gas; and
   depositing said reactive intermediaries on said micromechanical devices.

9. The method of claim 8, said organic gas comprising a p-xylylene polymer.

10. The method of claim 8, said organic gas comprising a fluorocarbon polymer.

11. The method of claim 8, said organic gas comprising hexafluoropropylene oxide.

12. The method of claim 1, said vapor deposition comprising:
    providing an organic gas;
    exposing said organic gas to a heated filament to generate reactive intermediaries of said organic gas; and
    depositing said reactive intermediaries on said micromechanical devices.

13. The method of claim 12, said organic gas comprising a p-xylylene polymer.

14. The method of claim 12, said organic gas comprising a fluorocarbon polymer.

15. The method of claim 12, said organic gas comprising hexafluoropropylene oxide.

16. The method of claim 1, said overcoating comprising conformally overcoating said micromechanical device.

17. The method of claim 1, said overcoating comprising overcoating a micromirror device.

18. The method of claim 1, said forming comprising forming at least two micromechanical devices on a common silicon substrate.

19. The method of claim 1, comprising:
    cleaning separation debris from said devices prior to said removing said overcoat from said micromechanical devices.

20. The method of claim 1, comprising:
    testing said micromechanical devices prior to said overcoating.

21. The method of claim 1, said forming comprising forming at least two micromechanical devices having at least one moveable element, wherein said overcoating is sufficient to immobilize said moveable element.

22. A method of fabricating a micromechanical device, the method comprising:
    forming at least two micromechanical devices on a common substrate;
    providing a plasma of an organic gas;
    generating reactive intermediaries of said plasma;
    depositing an overcoat of said reactive intermediaries on said micromechanical devices;
    separating said common substrate to separate said micromechanical devices; and
    removing said overcoat from said micromechanical devices.

23. The method of claim 22, said organic gas comprising vinylic hydrocarbons.

24. The method of claim 22, said organic gas comprising fluorocarbons.

25. The method of claim 22, said forming comprising forming at least two micromechanical devices having at least one moveable element, wherein said depositing is sufficient to immobilize said moveable element.

26. A method of fabricating a micromechanical device, the method comprising:

forming at least two micromechanical devices on a common substrate;

providing an organic gas;

exposing said organic gas to at least one electrical conductor held at a high voltage potential to generate reactive intermediaries of said organic gas;

depositing said reactive intermediaries on said micromechanical devices;

separating said common substrate to separate said micromechanical devices; and removing said overcoat from said micromechanical devices.

27. The method of claim 26, said organic gas comprising vinylic hydrocarbons.

28. The method of claim 26, said organic gas comprising fluorocarbons.

29. The method of claim 26, said forming comprising forming at least two micromechanical devices having at least one moveable element, wherein said depositing is sufficient to immobilize said moveable element.

30. A method of fabricating a micromechanical device, the method comprising:

forming at least two micromechanical devices on a common substrate;

providing an organic gas;

heating said organic gas to generate reactive intermediaries of said organic gas;

depositing said reactive intermediaries on said micromechanical devices;

separating said common substrate to separate said micromechanical devices; and removing said overcoat from said micromechanical devices.

31. The method of claim 30, said organic gas comprising a p-xylylene polymer.

32. The method of claim 30, said organic gas comprising a fluorocarbon polymer.

33. The method of claim 30, said organic gas comprising hexafluoropropylene oxide.

34. The method of claim 30, said forming comprising forming at least two micromechanical devices having at least one moveable element, wherein said depositing is sufficient to immobilize said moveable element.

35. A method of fabricating a micromechanical device, the method comprising:

forming at least two micromechanical devices on a common substrate;

providing an organic gas;

exposing said organic gas to a heated filament to generate reactive intermediaries of said organic gas;

depositing said reactive intermediaries on said micromechanical devices;

separating said common substrate to separate said micromechanical devices; and removing said overcoat from said micromechanical devices.

36. The method of claim 35, said organic gas comprising a p-xylylene polymer.

37. The method of claim 35, said organic gas comprising a fluorocarbon polymer.

38. The method of claim 35, said organic gas comprising hexafluoropropylene oxide.

39. The method of claim 35, said forming comprising forming at least two micromechanical devices having at least one moveable element, wherein said depositing is sufficient to immobilize said moveable element.

* * * * *